United States Patent [19]

Ninomiya et al.

[11] Patent Number: 4,559,100
[45] Date of Patent: Dec. 17, 1985

[54] MICROWAVE PLASMA ETCHING APPARATUS

[75] Inventors: Ken Ninomiya, Nakano; Shigeru Nishimatsu, Kokubunji; Keizo Suzuki, Hachioji; Sadayuki Okudaira, Ome; Yoshifumi Ogawa, Kudamatsu, all of Japan

[73] Assignee: Hitachi, Ltd., Tokyo, Japan

[21] Appl. No.: 684,299

[22] Filed: Dec. 20, 1984

[30] Foreign Application Priority Data

Dec. 23, 1983 [JP] Japan .................. 58-241988

[51] Int. Cl.$^4$ .................. H01L 21/306; C23F 1/03; B44C 1/22; C03C 15/00
[52] U.S. Cl. .................. 156/345; 156/643; 156/646; 204/192 E; 204/298
[58] Field of Search .................. 156/345, 643, 646; 204/192 E, 298; 118/728, 50.1, 620; 427/38, 39

[56] References Cited

U.S. PATENT DOCUMENTS 4,339,326 7/1982 Hirose .................. 156/345 X
4,462,863 7/1984 Nishimatsu et al. .................. 156/646 X

FOREIGN PATENT DOCUMENTS 57-99744 6/1982 Japan .................. 156/345

Primary Examiner—William A. Powell
Attorney, Agent, or Firm—Antonelli, Terry & Wands

[57] ABSTRACT

A microwave plasma etching apparatus comprises: a discharge tube into which a discharge gas is supplied and which forms a discharge region; means for generating a magnetic field in the discharge region; means for bringing a microwave into the discharge region; and a stage for holding a material. In the present invention, the sample exists in the discharge region. On one hand, an area of a passage for draining particles to the outside from the discharge region is 5/16 or less of an area of the discharge region. For this purpose, for example, a diameter of the sample stage is ¾ or more of a diameter of the discharge region.

8 Claims, 8 Drawing Figures

MICROWAVE PLASMA ETCHING APPARATUS

BACKGROUND OF THE INVENTION

The present invention relates to a plasma etching apparatus and, more particularly, to a microwave plasma etching apparatus which is suitable for rapid etching of Si, SiO₂, W, Al, etc.

Improvement in mass-productivity of plasma etching apparatus is strongly required at present. To meet this requirement it is desired that an increase in number of wafers which can be processed at one time, and a reduction of time needed for etching a single wafer, that is, faster etching be achieved. The first above, method, is currently in use in batch process plasma etching, while the other is currently in use in single wafer process plasma etching. In batch processing many wafers are etched at one time; hence, this method is ideal for mass production. In the single wafer processing each wafer is etched separately. This technique requires imporvement for mass production.

FIGS. 1 to 3 show schematic diagram of such conventional etching apparatus. Both FIGS. 1 and 2 show batch process apparatus. FIG. 1 is a microwave plasma etching apparatus; and FIG. 2 is an RF (Radio Frequency) plasma etching apparatus. In both apparatuses, a plurality of wafers 6 placed on a plate 7 or an electrode 10 are etched simultaneously. FIG. 3 shows a single wafer process plasma etching apparatus, and this apparatus is substantially similar to that shown in FIG. 2. Its difference from FIG. 2 is that a slab of material is put on the electrode 10 and the wafers are etched one by one.

Improvement for mass production is required in both single and batch wafer processing. However, in practice, most manufacturers try to etch faster; in the single wafer process because:

(1) Although 3 inch diameter wafer is mainly used at present, wafers of 4-6 inch diameter will be used in the future. To simultaneously process many large wafers in batch processing, the etching chamber 9 has to be made larger. This requires that the floor area or the height of the apparatus be increased, but this is not in accord with the current trend toward miniaturization of plasma etching apparatus.

(2) As semiconductor circuit elements become smaller, more accurate etching is required. The current state of the art is such that irregularities appear on the surface of the wafer prior to etching. It is diffucult to etch such wafers simultaneously.

The microwave plasma etching apparatus of FIG. 1 uses plasma which is generated by the combined effects of a microwave at 2.45 GHz generated by a magnetron 1 and a magnetic field produced by solenoids 3 and a permanent magnet 8. This kind of etching allows submicron pattern delineation with damage and contamination, but the etch rate is lower compared with the RF plasma etching method. It is obvious that there is a need to increase the etch rate for single wafer microwave plasma etching apparatus.

SUMMARY OF THE INVENTION

It is an object of the present invention to provide a microwave plasma etching apparatus which can etch Si, SiO₂, W, and Al, rapidly.

It was known that etch rate depends on the vertical position of the sample in the etching chamber in the apparatus shown in FIG. 4. However, practical etch rate could not be obtained.

When the etched material 13 was raised in a discharge tube 4, the etch rate was as shown in FIG. 5. In FIG. 5, if the height of sample is layer than 200 mm the etched material 13 is in the discharge tube 4. When the etched material 13 is placed in the discharge tube 4, the etch rate increases as the gap between the discharge tube 4 and the stage 14 for holding the etched material 13 decreases.

The reason is as follows. In microwave plasma etching apparatus, the magnetic field is generally formed such that the magnetic flux density of the magnetic field which is produced by the solenoid 3 is maximum near the point of the discharge tube 4 (K. Suzuki et al, Jpn. J. Appl. Phys. 16, 1979 (1977)). As shown in FIG. 6, the magnetic flux density varies with the axial direction. The proper adjustment of the electric current of each solenoid 3 is such that magnetic flux density is maximum slightly inside of the point of the discharge tube 4. It is therefore presumed that the microwave is most efficiently absorbed near the point of the discharge tube 4 and that the most reactive particles are formed there. Assuming that most ractive particles are formed near the point of the discharge tube 4, fewer reactive particles will impiage to the surface of the etched material 13, as the etched material 13 is moved away from this region. We can assume that this is due to the short life time of the particles as well as to particle diffusion in the chamber. When the etched material 13 is in the discharge tube, the practical etch rate is obtained. As was noted above, etch rate depends on the vertical position of the sample. Experiments have shown that the optimum position of the sample is in the discharge to the 4 and is no more than 300 mm from the point having the maximum magnetic flux density.

The reason why etching speed increases as the gap between the stage 14 and the discharge tube 4 is as follows. By narrowing the gap between the stage 14 and the discharge tube 4, the effective pumping speed for the particles existing in the discharge tube 4 becomes smaller. This raises the discharge pressure in the discharge tube 4 and extends the residence time of the reactive particles. As the pressure in the discharge tube 4 increases, so does the concentration of the reactive particles (K. Ninomiya et al, Jpn. J. Appl. Phys. 22, 139 (1983)), while an increase in the residence time of the particles results in an increase in frequency of impingement of the reactive particles onto the surface of the sample. This increase in concentration of the reactive particles and in frequency of impingement also increases etch rate.

The gap between the stage 14 and the discharge tube 4 must be considered carefully when the etched material 13 is put in the discharge tube 4. Although the effective pumping speed for the particles in the discharge tube 4 is reduced as the gap is narrowed, the experiments show that, this effect actually appear only when the diameter of the stage 14 was ¾ or more of the inner diameter of the discharge tube 4; that is, the area was 9/16 or more. When the stage 14 comes into contact with the discharge tube 4, however, the pumping rate falls to zero, so that the etching rate rapidly decreases. Consequently, it can be presumed that the optimum value exists when the diameter of the stage 14 lies within a range of ¾ to 1 of the inner diameter of the discharge tube 4. On the other hand, since this problem is based on the reduction of the effective pumping rate, even if the diameter of the sample stage 14 is less than ¾ of the inner diameter of the discharge tube 4, a similar effect will be obtained by slowing the effective pumping rate by attaching a cover to the stage 14.

As described above, in the microwave plasma etching apparatus, to increase the etch rate and improve the single wafer process, it is necessary to adopt a configuration in which the etched material 13 is put in the discharge tube 4 and the effective pumping speed for the particles existing in the discharge tube 4 is reduced. The present invention can be also applied as it is to the plasma deposition.

DETAILED DESCRIPTION OF THE PREFERRED EMBODIMENTS

Embodiments of the present invention will now be described with respect to the etching process.

[Embodiment 1]

Figure 1:
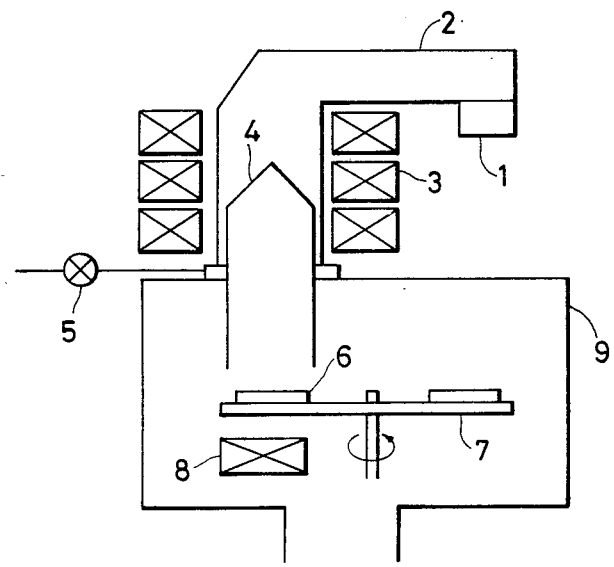
FIGS. 1 to 3 are diagrams showing a batch process microwave plasma etching apparatus, a batch process RF plasma etching apparatus and a single wafer process RF plasma etching apparatus, respectively.
Figure 2:
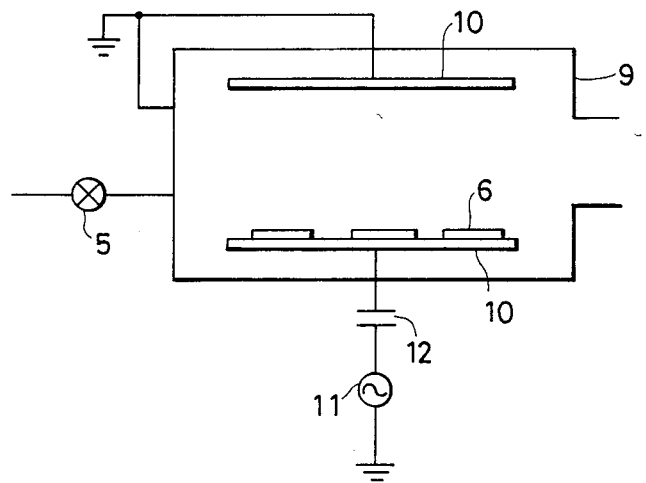
Figure 3:
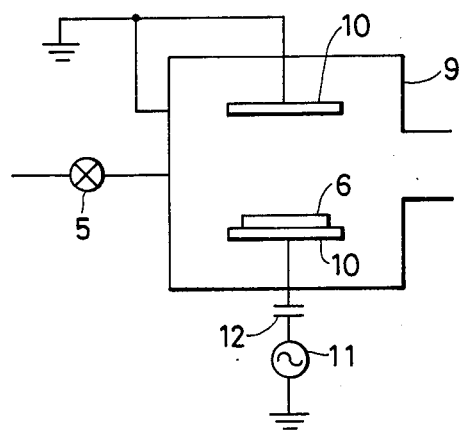
Figure 4:
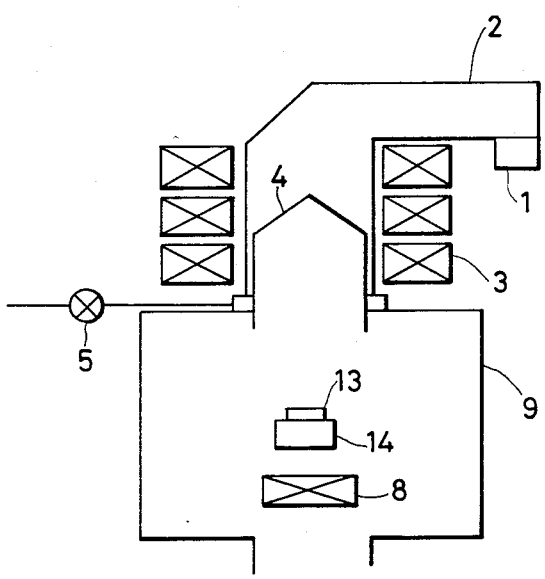
FIG. 4 is a diagram showing a conventional microwave plasma etching apparatus.
Figure 5:
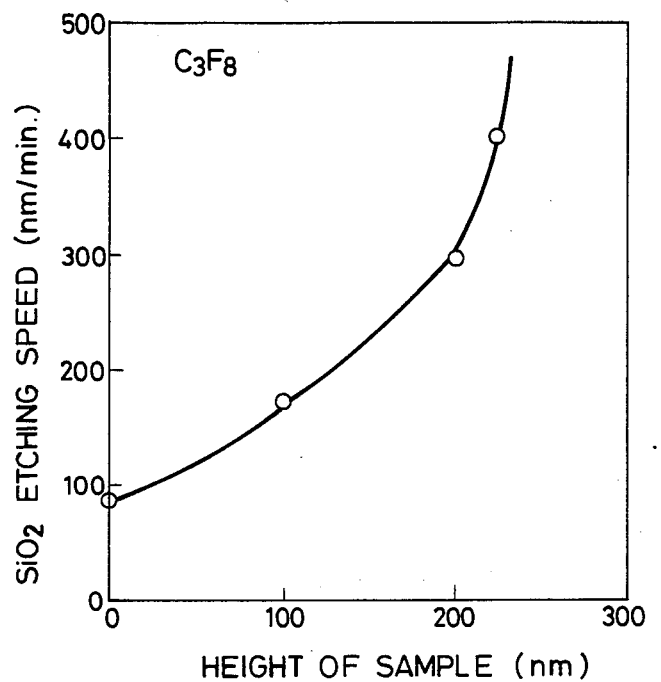
FIG. 5 is a diagram showing the relation between $SiO_2$ etching rate and vertical position of the sample.
Figure 6:
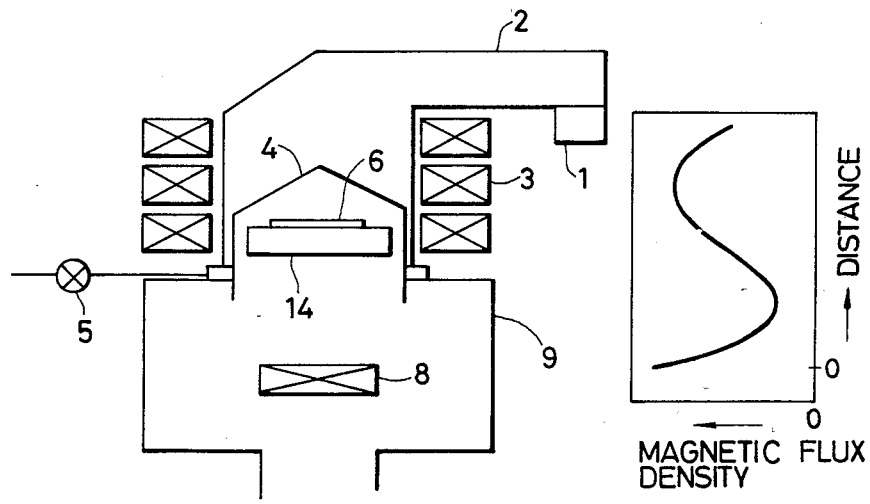
FIG. 6 is a diagram showing a single wafer process microwave plasma etching apparatus according to one embodiment of the present invention.

FIG. 6 shows the simplest embodiment. In FIG. 6, the wafer 6 is put in the discharge tube 4 with the sample stage 14. The wafer 6 is disposed at a position within 300 mm or less toward the direction of propagation of the microwave from the position of the maximum magnetic flux density which is produced on the central axis of the discharge tube by the solenoid 3. The diameter of the stage 14 is set to be ¾ or more of the inner diameter of the discharge tube 4.

With such an arrangement, both the concentration and the residence time of the reactive particles in the space surrounded by the discharge tube 4 and sample stage 14 increase, and at the same time the reactive particles efficiently enter the surface of the wafer 6, so that the etch rate is remarkably raised.

[Embodiment 2]

Figure 7:
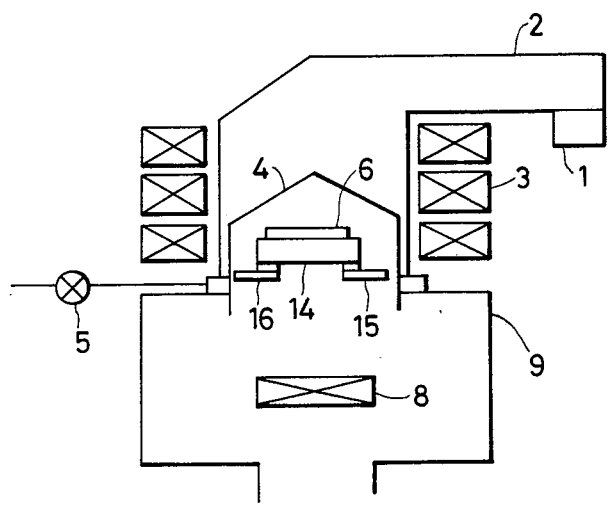
FIGS. 7 and 8 are diagrams showing other embodiments of the invention.

FIG. 7 shows an embodiment whereby a cover 15 is attached to the stage 14 instead of enlarging the diameter of the stage 14. An essential point of the present invention is to decrease the effective pumping speed for the particles existing in the discharge tube 4; therefore, even if the cover 15 is attached as shown in FIG. 7, a similar effect as in Embodiment 1 will be derived. It is apparent that the diameter of the cover 15 is set to be ¾ or more of the inner diameter of the discharge tube 4.

[Embodiment 3]

Figure 8:
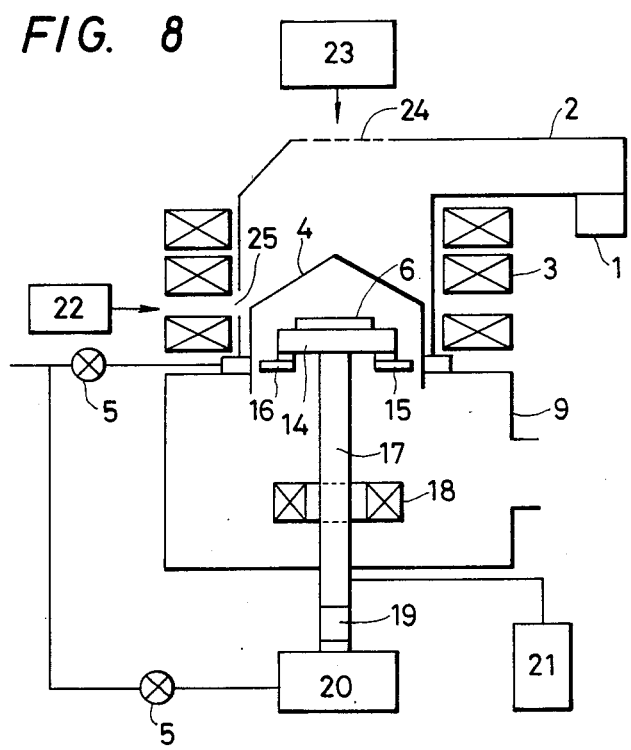

FIG. 8 is a schematic diagram of an example in which several mechanisms are added to Embodiment 2. The sample stage 14 and cover 15 are supported by a supporting axis 17. An insulating mechanism 19 and a vertical rotating mechanism 20 are connected to the supporting axis 17. The insulating mechanism 19 insulates the wafer 6 from the others and may be disposed at any position if it can insulate the wafer 6. An external power source 21 is connected to the supporting axis 17. The external power source 21 serves to apply a DC (direct current) or RF bias to the wafer 6 from the outside. Therefore, any method of connecting the external power source 21 to the supporting axis 17 may be adopted if an external voltage can be applied to the wafer 6.

The etching gas is supplied through a flow control valve 5. Particularly in this embodiment, a part of the etching gas is supplied through the insulating mechanism 19 and supporting axis 17 in a manner such that the gas is blown toward the back surface of the wafer 6 from the stage 14. Thus, a cooling effect for the wafer 6 is derived.

A doughnut-like permanent magnet 18 may be divided. In addition, the permanent magnet 18 can be fixed in the etching chamber 9 and is also vertically movable together with the sample stage 14.

Detecting units 22 and 23 are monitors. Unit 22 monitors emission immediately over the wafer 6 through a hole 25 and can also monitor the end point. Unit 23 monitors the whole surface of the wafer to ensure uniformity.

Although the embodiments described here relate to etching, it is obvious that the embodiments have other fields of application for surface treatments such as deposition. Further, the embodiments are also effective with materials other than Si, $SiO_2$, W, Al.

With the present invention, single wafer etching of Si, $SiO_2$, W, and Al, can be performed rapidly; therefore, the invention increases the production rate of microwave plasma etching apparatus. The invention is not limited to the above-mentioned materials to be etched; other materials are also effective. The invention can be also applied to other surface treatment methods such as deposition.

What is claimed is:

1. A microwave plasma etching apparatus using a microwave discharge with a magnetic field, in which a material to be etched exists in a discharge region.

2. An apparatus according to claim 1, wherein the cross sectional area of a passage to drain particles from said discharge region is 5/16 or less of the area of said discharge region.

3. An apparatus according to claim 2, wherein a sample stage for supporting said sample is provided and at least one of a diameter of said sample stage and a diameter of a circular cover attached to said sample stage through an insulative material is ¾ or more of an inner diameter of said discharge region within a range such that said sample stage or said circular cover does not come into contact with an inner wall of said discharge region.

4. An apparatus according to claim 2, wherein said sample is placed at a position which is 300 mm or less in the direction of propagation of said microwave from a point of the maximum magnetic flux density on a central axis of said discharge region.

5. An apparatus according to claim 3, wherein a voltage is independently applied from an external power source to said material or to said material and said stage.

6. An apparatus according to claim 2, further comprising means for cooling said material.

7. A microwave plasma etching apparatus comprising: a discharge tube into which a discharge gas is supplied and which forms a discharge region; means for generating a magnetic field in said discharge region; means for bringing a microwave into said discharge region; and a stage for holding a material in said discharge region.

8. A device according to claim 7, wherein a diameter of said stage is ¾ or more of the diameter of said discharge region.

* * * * *